ated under 35

United States Patent
Kang et al.

(10) Patent No.: US 8,843,349 B2
(45) Date of Patent: Sep. 23, 2014

(54) APPARATUS FOR REMOVING THE PARTIAL DISCHARGE NOISE OF AN ELECTRICAL POWER FACILITY AND APPARATUS FOR DETECTING A PARTIAL DISCHARGE GENERATED SECTION

(75) Inventors: Chang-Won Kang, Gyeonggi-do (KR);
Jae-Ok Choi, Gyeonggi-do (KR);
Yeung-Noh Kim, Seoul (KR);
Chul-Min Hwang, Seoul (KR);
Chul-Kwang Choi, Gyeonggi-do (KR)

(73) Assignee: Power System Diagnosis Tech., Inc., Gyeonggi-do (KR)

( * ) Notice: Subject to any disclaimer, the term of this patent is extended or adjusted under 35 U.S.C. 154(b) by 773 days.

(21) Appl. No.: 13/054,464

(22) PCT Filed: Jul. 14, 2009

(86) PCT No.: PCT/KR2009/003835
§ 371 (c)(1),
(2), (4) Date: Mar. 26, 2011

(87) PCT Pub. No.: WO2010/008168
PCT Pub. Date: Jan. 21, 2010

(65) Prior Publication Data
US 2011/0172970 A1   Jul. 14, 2011

(30) Foreign Application Priority Data
Jul. 14, 2008 (KR) .................. 10-2008-0068084

(51) Int. Cl.
*G01R 31/08* (2006.01)
*G01R 31/12* (2006.01)
*H02H 1/04* (2006.01)
*H02H 1/00* (2006.01)

(52) U.S. Cl.
CPC .............. *G01R 31/1254* (2013.01); *H02H 1/04* (2013.01); *G01R 31/12* (2013.01); *G01R 31/1272* (2013.01); *H02H 1/0015* (2013.01)
USPC .......................................... 702/191; 324/536

(58) Field of Classification Search
CPC .............. G01R 31/1254; G01R 31/12; G01R 31/1272; G01R 31/3275; H01H 33/26
USPC .......................................... 702/191; 324/536
See application file for complete search history.

(56) References Cited

U.S. PATENT DOCUMENTS 5,146,170 A * 9/1992 Ishikawa et al. ............. 324/536
5,200,737 A * 4/1993 Konishi et al. ............... 340/644

(Continued)

FOREIGN PATENT DOCUMENTS

JP       2001033508 A  *  2/2001
KR    10-2001-0079445      8/2001

(Continued)

OTHER PUBLICATIONS

English language abstract of KR 10-2001-0079445.

(Continued)

*Primary Examiner* — John Breene
*Assistant Examiner* — Timothy H Hwang
(74) *Attorney, Agent, or Firm* — Rabin & Berdo, P.C.

(57) ABSTRACT

An apparatus being capable of quickly removing noise from a partial discharge signal generated from the electrical power facility such as a gas insulated switchgear (GIS) and the like, and an apparatus for detecting a partial discharge generated section. The apparatus for removing noise from a partial discharge signal comprises a PD signal detection unit configured to detect a PD signal of the power facility and to detect and output peaks of the PD signal in respective preset time intervals, a noise signal detection unit configured to detect a noise signal outside the power facility and to detect and output peaks of the noise signal in the respective preset time intervals, and a noise removal unit configured to eliminate the peaks of the PD signal output in time intervals identical to those in which the peaks of the noise signal detection unit are output.

12 Claims, 9 Drawing Sheets

(56) References Cited

U.S. PATENT DOCUMENTS

| | | | |
|---|---|---|---|
| 5,256,976 A * | 10/1993 | Ishikawa et al. | 324/522 |
| 7,183,774 B2 * | 2/2007 | Kuppuswamy | 324/536 |
| 2002/0014890 A1 * | 2/2002 | Cooke | 324/536 |
| 2005/0012507 A1 * | 1/2005 | Kaneda et al. | 324/536 |
| 2006/0132144 A1 * | 6/2006 | Kato et al. | 324/536 |
| 2007/0139056 A1 * | 6/2007 | Kaneiwa et al. | 324/536 |

FOREIGN PATENT DOCUMENTS

| | | |
|---|---|---|
| KR | 10-2007-0038191 | 4/2007 |
| KR | 10-2007-0096498 | 10/2007 |
| KR | 10-0853725 B1 | 8/2008 |

OTHER PUBLICATIONS

English language abstract of KR 10-2007-0038191.
English language abstract of KR 10-2007-0096498.
International Search Report of PCT/KR2009/003835 mailed on Feb. 2, 2010.

* cited by examiner

APPARATUS FOR REMOVING THE PARTIAL DISCHARGE NOISE OF AN ELECTRICAL POWER FACILITY AND APPARATUS FOR DETECTING A PARTIAL DISCHARGE GENERATED SECTION

CROSS-REFERENCE TO RELATED APPLICATIONS

The present application is a national stage application under 35 U.S.C. §371 of international application number PCT/KR2009/003835 with an international filing date of Jul. 14, 2009, and claims priority to KR10-2008-0068084 filed Jul. 14, 2008.

BACKGROUND OF THE INVENTION

1. Field of the Invention

The present invention relates to an apparatus for removing the Partial Discharge (PD) noise of a power facility and an apparatus for detecting a PD occurrence section, which can promptly remove noise from a PD signal generated by a power facility such as a Gas Insulated Switchgear (GIS), and can detect a PD occurrence section.

2. Description of the Related Art

Generally, in most domestic power plants/substations, Gas Insulated Switchgears (GISs) are used. Such a GIS is an integrated switch device in which disconnectors, buses, ground devices, transformers, etc. are accommodated in a metal box and in which a charging unit is insulated using an SF6 gas, that is, a single system into which disconnectors, arrestors, circuit breakers, etc., which were separately provided in existing substations, are integrated. Such a GIS is not only safer than a previous open-type switch device due to its insulation performance, but also has a greatly reduced insulation area. Therefore, in most current substations, GISs have been newly established or existing switch devices have been replaced with GISs. Therefore, it is required to ensure maintenance management technology and permanent insulation diagnosis technology which guarantee reliability so as to prevent accidents related to GISs and stably operate GISs.

Korean Patent Appln. No. 2007-60191 entitled "Method and apparatus for analyzing the cause of partial discharge of a GIS using a Phase Resolved Pulse Sequence (PRPS) algorithm," filed by the applicant of the present invention (hereinafter referred to as "prior art"), describes permanent insulation diagnosis technologies for conventional GISs designed to meet such requirements.

The prior art is configured to include a sensor unit, an analog processing unit, an Analog/Digital (A/D) converter, a digital signal processing unit, a database (DB) unit for storing the reference characteristic patterns of a neural network algorithm, a neutral network circuit, a second neural network circuit, and a final probability calculation unit. The prior art amplifies the analog signals of electromagnetic waves generated from the inside of a GIS, detects the maximum value of the analog signals, converts the maximum value into a digital signal, divides each voltage phase cycle appearing for a preset analysis unit time by a predetermined value into binaries which are unitary intervals, ands calculates an input vector composed of the sum of the numbers of discharges of in-phase binaries placed in the cycle of each voltage phase and the average discharge signal intensity of the in-phase binaries discharge signals, which is obtained by dividing the sum of the numbers of discharges by the number of cycles. Further, the prior art calculates a probability that the input vectors calculated by the neural network circuit and the second neural network circuit will be identical to each individual reference characteristic pattern of the DB unit by assigning different weights to the input vectors, applies weights calculated from recognition rates for respective causes of PD to the probabilities for the respective causes of the PD, which are output from the neural network circuit and the second neural network circuit, adds the resulting probabilities for respective PD causes, and calculates a single probability, so that noise or the like which is the cause of the PD can be analyzed, thus enabling PD occurring inside the GIS to be analyzed for respective causes.

In this case, in the above-described prior art, a sensor is shielded or, alternatively, a band pass filter used in hardware is employed so that noise is prevented from flowing into a portion around the sensor so as to remove the noise when a PD signal is measured.

However, a noise removal method applied to the above-described prior art can efficiently remove noise in the case when normal noise is to be removed, but cannot remove noise attributable to a nearby motor or wideband impulse noise occurring in a welding machine or the like. Further, in the case of a band pass filter, when a noise frequency band is included in the pass band thereof, noise is input as a signal required to analyze the patterns of PD without being removed, and thus a problem arises in that a resulting value output from a probability calculation unit is erroneously calculated to cause noise to be erroneously determined and to be a PD signal.

Accordingly, the present invention has been made keeping in mind the above problems occurring in the prior art, and an object of the present invention is to provide an apparatus for removing the PD noise of a power facility and an apparatus for detecting a PD occurrence section, which can precisely and easily remove a noise signal, measured by a noise sensor, from radio wave signals detected by a measurement sensor provided inside a GIS, thus detecting a PD occurrence section while remarkably improving the reliability of resulting values obtained by PD pattern analysis devices such as conventional PRPS devices.

SUMMARY OF THE INVENTION

An apparatus for removing Partial Discharge (PD) noise of a power facility according to the present invention to accomplish the above object includes a PD signal detection unit for detecting a PD signal of a power facility, and detecting and outputting peaks of the PD signal in respective preset time intervals; a noise signal detection unit for detecting a noise signal outside the power facility, and detecting and outputting peaks of the noise signal in respective preset time intervals; and a noise removal unit for eliminating peaks of the PD signal generated in time intervals identical to those in which the peaks of the noise signal detection unit are generated.

An apparatus for detecting a Partial Discharge (PD) occurrence section of a power facility according to the present invention to accomplish the above object includes two or more PD signal detection units, each installed in the power facility so as to detect a PD signal of the power facility and detect and output peaks of the PD signal in respective preset time intervals; and a PD occurrence section detection unit configured to compare intensities of peaks of respective PD signals of neighboring PD signal detection units of the two or more PD signal detection units, and to output a location between two of the neighboring PD signal detection units having a minimum peak difference therebetween as a PD occurrence section.

In this case, when two PD signal detection units are provided, the PD occurrence section detection unit may be configured to compare intensities of the peaks of respective PD signals detected by the PD signal detection units and detect a region adjacent to a location to which a PD measurement sensor unit of a PD signal detection unit, which detected a PD signal corresponding to a larger PD signal peak, is attached, as a PD occurrence section.

Further, the PD occurrence section detection apparatus may be configured to have a noise signal removal function. In this case, the PD occurrence section detection apparatus includes two or more PD signal detection units, each installed in the power facility so as to detect a PD signal of the power facility and detect and output peaks of the PD signal in respective preset time intervals; a noise signal detection unit configured to detect a noise signal outside the power facility, and detecting and outputting peaks of the noise signal in respective preset time intervals; and a noise removal and PD occurrence section detection unit configured to remove a noise signal from the PD signal by eliminating peaks of the PD signal generated in time intervals identical to those in which the peaks of the noise signal detection unit are generated, and configured to compare intensities of peaks of respective PD signals of neighboring PD signal detection units of the two or more PD signal detection units, and to output a location between two of the neighboring PD signal detection units having a minimum peak difference therebetween as a PD occurrence section.

Next, each of the PD signal detection units may include a PD measurement sensor unit installed in the power facility and configured to detect a PD signal; a PD analog processing unit configured to convert the PD signal detected by the PD measurement sensor unit into a reference frequency signal for signal processing and output the reference frequency signal; and a PD peak detection unit configured to detect peaks of the PD signal from the reference frequency signal that is output from the PD analog processing unit, in the respective preset time intervals, and output the detected peaks.

The noise signal detection unit may include a noise sensor unit installed outside the power facility and configured to detect an external noise signal; a noise analog processing unit configured to convert the noise signal detected by the noise sensor unit into a reference frequency signal; and a noise peak detection unit configured to detect peaks of the noise signal from the reference frequency signal output from the noise analog processing unit, in respective preset time intervals and output the peaks.

Further, of the above components, the PD analog processing unit and the noise analog processing unit may have the same construction for performing the same function of dividing the detected PD signal and the detected noise signal into preset time intervals without converting the PD signal and the noise signal into digital signals, and each may include a low-noise amplifier for amplifying an analog signal measured by any one of a PD measurement sensor and a noise measurement sensor; a digital control attenuator for adjusting intensity of an output signal output from the low-noise amplifier; a filter matrix for passing only a required frequency band of the measured signal therethrough; and a zero-phase detector for converting the measured signal into a reference frequency signal for signal processing when the measured signal is a Ultra-High Frequency (UHF) signal.

The apparatus for removing the PD noise of the power facility having the above construction according to the present invention may detect PD signals of the power facility using the PD signal detection units, detect peaks of the detected PD signals from the detected PD signals in respective preset time intervals, and output the peaks of the PD signals.

Further, a noise signal may be detected outside the power facility using the noise signal detection unit, the peaks of the noise signal may be detected from the detected noise signal in respective preset time intervals, and the detected peaks may be output.

Thereafter, the noise signal may be removed from the detected PD signals by eliminating the peaks of the PD signals, which are detected by the PD signal detection units and are generated in time intervals identical to those in which the peaks of the noise signal detected by the noise signal detection unit are generated.

Next, the apparatus for detecting the PD occurrence section of the power facility having the above construction according to the present invention may detect PD signals of the power facility using the PD signal detection units, detect peaks of the detected PD signals from the detected PD signals in respective preset time intervals, and output the peaks of the PD signals.

Further, a noise signal may be detected outside the power facility using the noise signal detection unit, the peaks of the noise signal may be detected from the detected noise signal in respective preset time intervals, and the detected peaks may be output.

Next, among the peaks of pure PD signals in which noise peaks were eliminated from the peaks of PD signals of neighboring PD signal detection units, the peaks of pure PD signals generated in identical time intervals may be compared, and it may be determined that PD has occurred in a region between two neighboring PD signal detection units, having a minimum peak difference therebetween, and thus a PD occurrence section may be detected.

In this case, when only two PD signal detection units are provided, among the peaks of pure PD signals in which noise peaks were eliminated from the peaks of PD signals of the respective PD signal detection units, peaks of pure PD signals generated in identical time intervals may be compared, and it may be determined that PD has occurred in a region adjacent to a location where the PD measurement sensor unit of a PD signal detection unit having a larger PD signal peak is located, and thus a PD occurrence section may be detected.

Further, the above-described PD occurrence section detection apparatus may be configured to eliminate the peaks of PD signals, which are detected by the PD signal detection units and are generated in the time intervals identical to those in which the peaks detected by the noise signal detection unit are generated, so as to precisely detect a PD occurrence section.

The present invention having the above construction and performing the above operations provides advantages in that it promptly and precisely removes noise from PD signals generated in a power facility such as a GIS, thus improving the reliability of the detection of PD signals and the reliability of the results of PD pattern analysis.

Further, the present invention provides advantages in that a PD occurrence section within a power facility such as a GIS can be easily detected without requiring a user's identification with the naked eye or a separate measurement device, thus remarkably improving the efficiency of the maintenance of the GIS.

DESCRIPTION OF THE PREFERRED EMBODIMENTS

Hereinafter, the present invention will be described in detail with reference to the attached drawings.

Figure 1:
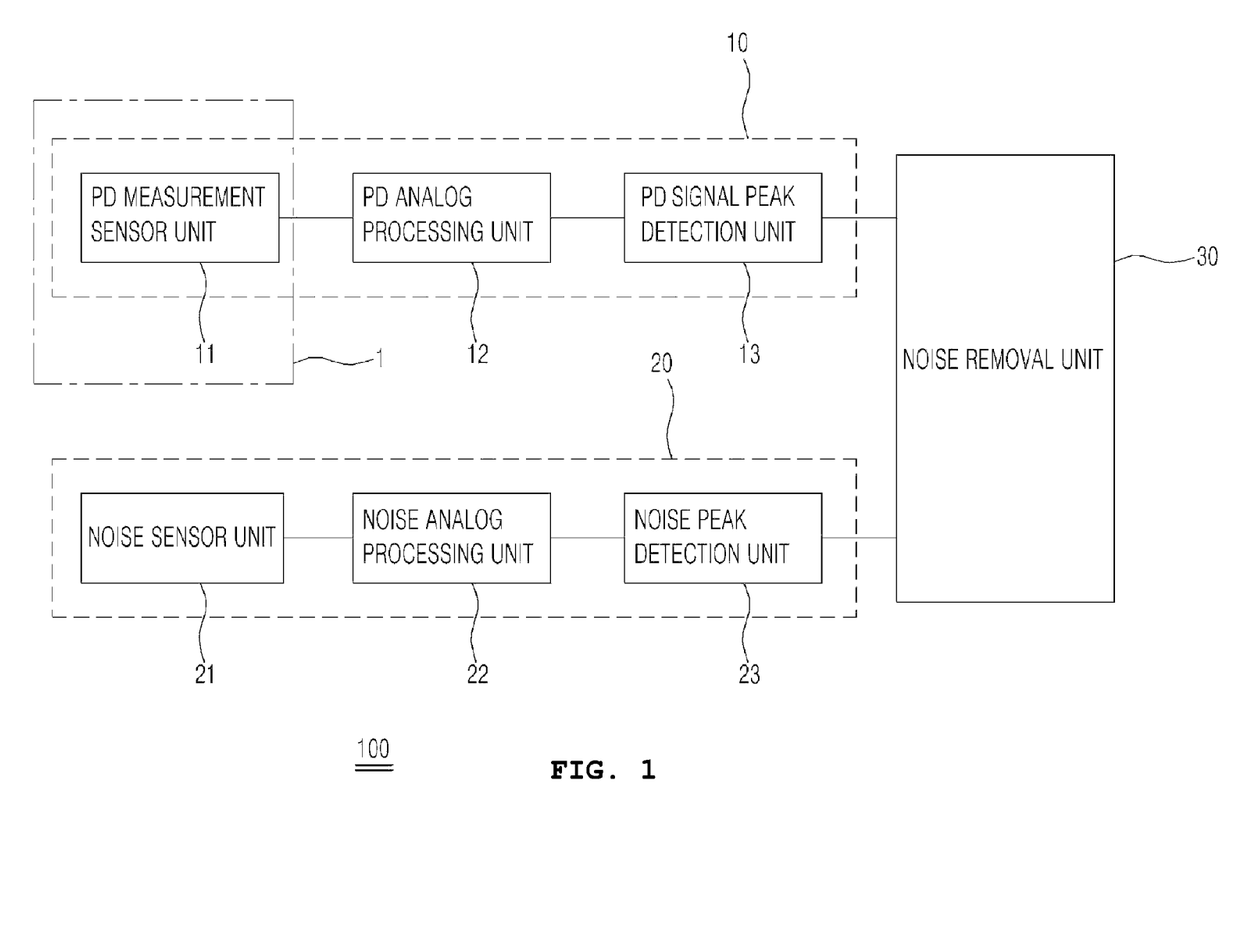
FIG. 1 is a block diagram showing the construction of an apparatus for removing a PD noise of a power facility according to an embodiment of the present invention.

FIG. 1 is a block diagram showing an apparatus 100 for removing a Partial Discharge (PD) noise of a power facility (hereinafter referred to as a "noise removal apparatus 100") according to an embodiment of the present invention.

As shown in FIG. 1, the above-described noise removal apparatus 100 for removing noise from a PD signal includes a PD signal detection unit 10 for detecting a PD signal generated inside a power facility such as a GIS 1 in a state in which the PD signal detection unit 10 is temporally synchronized with a noise signal detection unit 20, and for detecting and outputting the peaks of the PD signal in preset time intervals. The noise signal detection unit 20 can detect a noise signal outside the power facility, and detect and output the peaks of the noise signal in preset time intervals. Further, the noise removal apparatus 100 can include a noise removal unit 30 for eliminating the peaks of the PD signal output in the identical time intervals as the time intervals in which the peaks of the noise signal are output by the noise signal detection unit 20. Accordingly, after the noise removal apparatus 100 has been installed in the power facility such as in the GIS, it detects a PD signal generated by the power facility, and removes a noise signal from the detected PD signal, thus outputting only a pure PD signal.

In the above construction, the noise removal unit 30 can be configured to remove a noise signal contained in the PD signal by directly eliminating peak signals corresponding to the peaks of the noise signal from the peaks of the PD signal in the state of analog signals, or can be configured to receive analog signals output, that is, the peaks of the PD signal and peaks of the noise signal, from both the PD signal detection unit 10 and the noise signal detection unit 20, convert the peaks into digital signals, perform digital signal processing on the digital signals, and remove a noise signal from the PD signal. In this case, when the noise removal unit 30 is configured to perform digital signal processing, the noise removal unit 30 includes an analog/digital signal processing unit for converting analog signals into digital signals, and a digital signal processing unit such as firmware for performing digital operation processing that eliminates the peaks of a PD signal in time intervals identical to those in which the peaks of a noise signal are generated.

The pure PD signal in which a noise signal was removed by the noise removal apparatus 100 is input to a conventional central control unit so that the central control unit can analyze PD patterns or the like. When the noise removal unit 30 is configured to remove a noise signal from a PD signal by performing analog signal processing, the pure PD signal is input to the central control unit or the like after analog/digital (A/D) conversion, digital signal processing, etc. have been performed. When the removal of the noise signal from the PD signal is performed based on digital signal processing after conversion into digital signals has been performed, the pure PD signal is input to the central control unit or the like without separate digital signal conversion being performed.

Next, the above-described components will be described in detail below. As shown in FIG. 1, the PD signal detection unit 10 is configured to include a PD measurement sensor unit 11 which is attached to the inside of the power facility, such as the GIS 1, to detect a PD signal after being temporally synchronized with the noise signal detection unit 20, a PD analog processing unit 12 which converts the PD signal detected by the PD measurement sensor unit 11 into a reference frequency signal for signal processing and outputs the reference frequency signal, and a PD peak detection unit 13 which detects peaks from the reference frequency signal output from the PD analog processing unit 12 in respective preset time intervals and outputs the peaks of the PD signal. Thus, after detecting the PD signal generated by the power facility such as the GIS 1, the PD signal detection unit 10 detects the peaks of the detected PD signal in the respective preset time intervals, and output the peaks to the noise removal unit 30.

Further, as shown in FIG. 1, the noise signal detection unit 20 is configured to include a noise sensor unit 21 which is installed outside the power facility such as the GIS 1 to detect a noise signal after being temporally synchronized with the PD signal detection unit 10, a noise analog processing unit 22 which converts the noise signal detected by the noise sensor unit 21 into a reference frequency signal for signal processing and outputs the reference frequency signal, and a noise peak detection unit 23 which detects peaks from the reference frequency signal output from the noise analog processing unit 22 in respective preset time intervals and outputs the peaks of the noise signal. Accordingly, the noise signal detection unit 20 detects the noise signal generated outside and input from the power facility such as the GIS, at the time of detecting the PD signal generated by the power facility, detects the peaks of the detected noise signal in the respective preset time intervals, and then outputs the peaks of the noise signal to the noise removal unit 30 so that the noise signal can be removed from the PD signal by eliminating the peaks of the PD signal generated in time intervals identical to those in which the peaks of the noise signal are generated.

In the above components, each sensor of the PD measurement sensor unit 11 and the noise sensor unit 21 is an external electromagnetic sensor having a detection range of 500 to 1500 MHz, has sensitivity enabling an apparent PD magnitude of 5 pC or less according to International Electrotechnical Commission (IEC) 60270, and is preferably configured such that a shielding material is inserted into both a spacer and a sensor installation surface in the form of a gasket so as to minimize the inflow of external noise.

Further, a frequency detection band is a band ranging from 500 to 1500 MHz in an Ultra-High Frequency (UHF) band (300 to 3000 MHz), wherein a band below 500 MHz is a frequency band having strong external noise, and a band above 1500 MHz exhibits rapid attenuation due to high-frequency characteristics, and thus it is preferable to implement the frequency detection band so that a frequency band can be detected in consideration of those frequency characteristics.

Next, the noise removal unit 30 eliminates the peaks of the PD signal generated in the time intervals identical to those in which the peaks of the noise signal detected by the noise signal detection unit 20 are generated, removes the noise signal from the PD signal detected by the PD signal detection unit 10, and thereafter outputs a noise-free PD signal so that operations such as the analysis of PD patterns can be performed by the central control unit as in the case of the prior art.

In this case, the noise removal unit 30 can be selectively implemented using an analog or digital signal processing method, as described above. A sync generation unit (not shown) can be integrated into the noise removal unit 30 so as to provide synchronous clocks required to temporally synchronize the PD signal detection unit 10 with the noise signal detection unit 20, or, alternatively, a sync generation unit (not shown) separate from the noise removal unit 30 can be provided in the noise removal apparatus 100.

Among the components of the present invention, the PD analog processing unit 12 and the noise analog processing unit 22 perform analog signal processing of converting the detected PD signal or noise signal into the reference frequency signal required for signal processing and outputting the reference frequency signal. When analog signal processing on the PD signal is performed, the relevant unit is designated as the PD analog processing unit 12, whereas when analog signal processing on the noise signal is performed, the relevant unit is designated as the noise analog processing unit 22. Hereinafter, the PD analog processing unit 12 and the noise analog processing unit 22 will be collectively designated as an analog processing unit 12 or 22 and will be described in detail with reference to FIG. 2.

Figure 2:
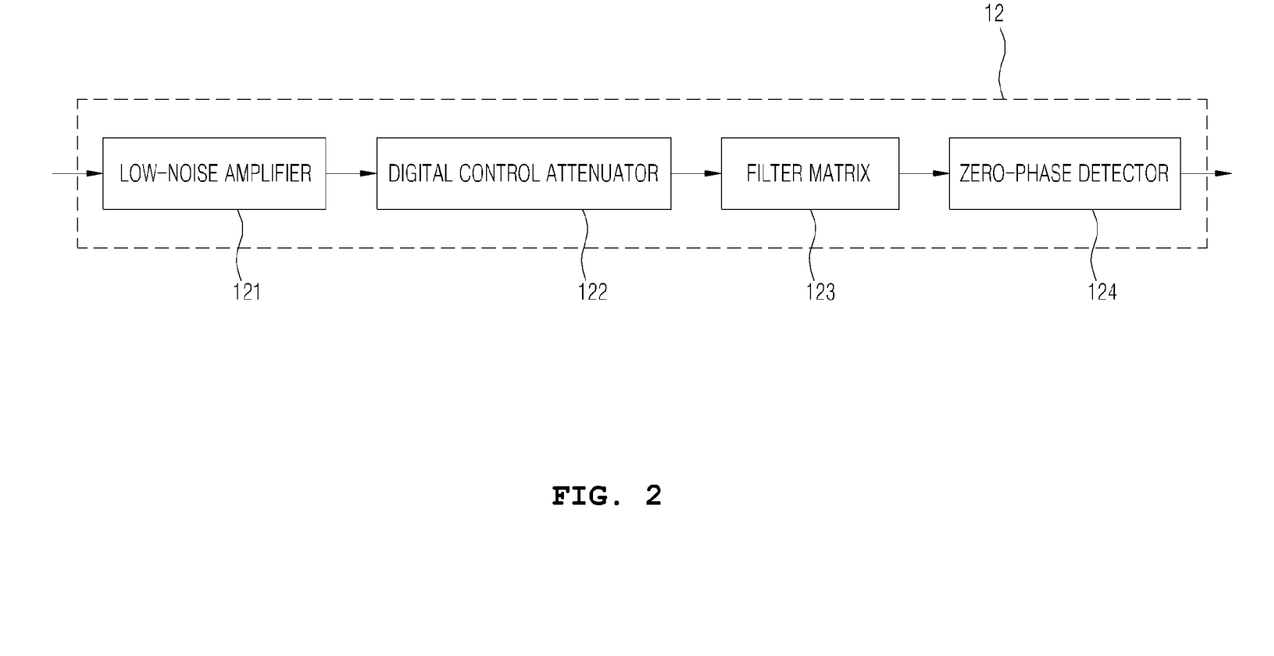
FIG. 2 is a block diagram showing the PD analog processing unit or noise analog processing unit of FIGS. 1, 6 and 7.
Figure 6A:
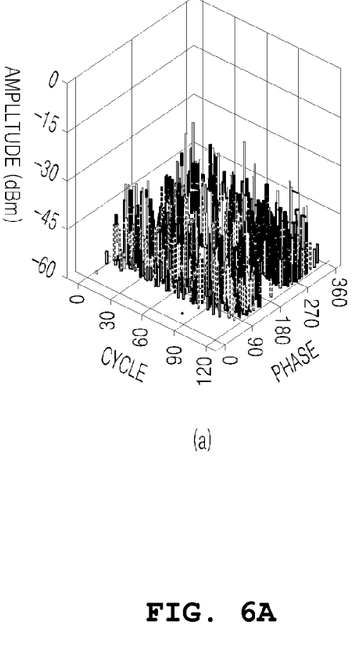
FIG. 6 is a diagram showing a PD signal, noise, and a noise-free PD signal in an actual noise removal apparatus.
Figure 6B:
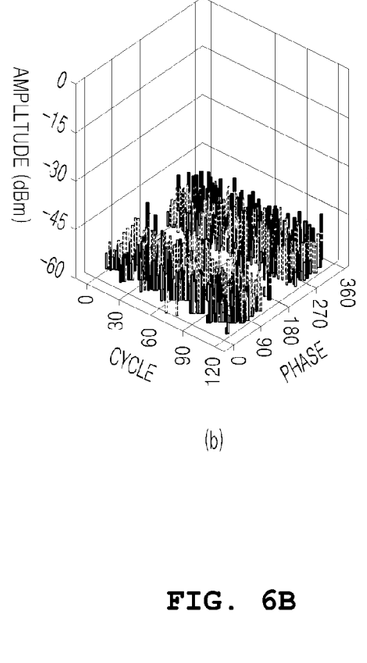
Figure 6C:
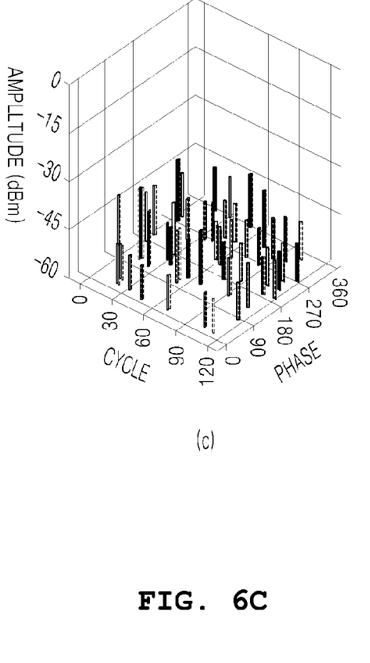
Figure 7:
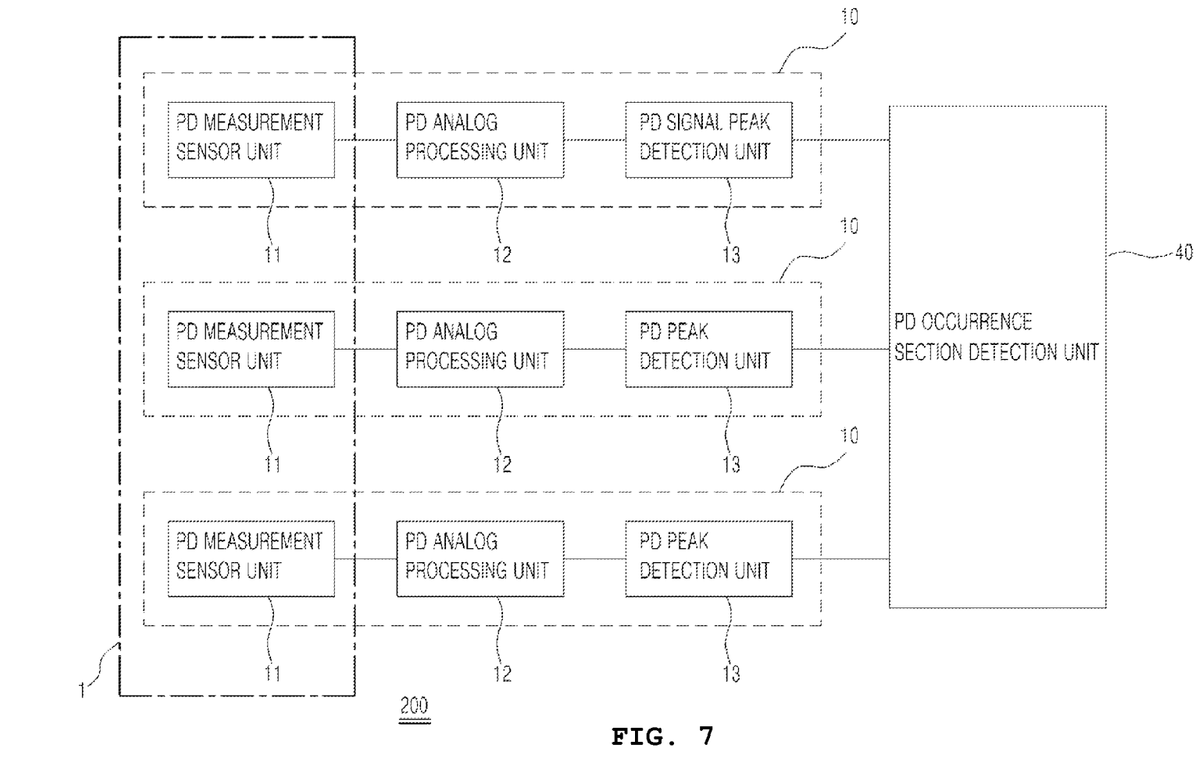
FIG. 7 is a diagram showing an apparatus for detecting a PD occurrence section of the power facility according to an embodiment of the present invention.

FIG. 2 is a block diagram showing the internal construction of the above-described analog processing unit 12 or 22 (the PD analog processing unit 12 or the noise analog processing unit 22) of FIGS. 1, 6, and 7.

As shown in FIG. 2, the analog processing unit 12 or 22 includes: a low-noise amplifier 121 for amplifying an analog PD signal or an analog noise signal measured by any one of the PD measurement sensor unit 11 and the noise sensor unit 21 of FIG. 1; a digital control attenuator 122 for adjusting the intensity of the output signal of the low-noise amplifier 121; a filter matrix 123 for passing only a required frequency band of the analog signal output from the digital control attenuator 122 therethrough; and a zero-phase detector 124 for converting the analog signal output from the filter matrix 123 into a reference frequency signal having a low frequency for signal processing when the analog signal is a wideband Ultra-High Frequency (UHF) signal. In addition, the analog processing unit 12 or 22 can further include components such as a component for controlling an applied voltage and memory, wherein the components such as the component for controlling the applied voltage and the memory are not the principal components of the invention and are well-known common means, and thus a detailed description thereof will be omitted.

The construction of the analog processing unit 12 or 22 will be described in detail below.

Of the components of the analog processing unit 12 or 22, the low-noise amplifier 121 and the digital control attenuator 122 are components commonly used to process analog signals. When the functions of the low-noise amplifier 121 and the digital control attenuator 122 are described in brief, the low-noise amplifier 121 amplifies a small signal detected by the PD measurement sensor unit 11 or the noise sensor unit 21, and the intensity of the amplified signal is adjusted by the digital control attenuator 122.

The filter matrix 123 functions to filter out various frequency bands having serious noise and to pass only a required frequency band therethrough. In Korea, since signals in a cellular phone band (890 MHz), a Personal Communications Service (PCS) band (1.8 GHz) and a Wireless-Local Area Network (WLAN) band (2.4 GHz), which have serious frequency interference, act as noise, the present embodiment is configured such that three band pass filters for filtering out those frequency bands are provided in parallel so as to filter out the frequency bands and to pass only a required frequency band therethrough. That is, in order to avoid frequency interference in a cellular phone band among electromagnetic signals, a band pass filter having such specifications as in the following reference table 1 is used.

(Reference Table 1)

| | |
|---|---|
| Center frequency | 1300 MHz |
| Pass band | 1-1.6 GHz, 0.6 GHz BW |
| Pass band ripple | 1.5 $dB_{Max}$ |
| Insertion loss | 2.0 $dB_{Max}$ |
| Impedance | 50Ω |

In order to avoid interference signals in the PCS band, a band pass filter having such specifications as in the following reference table 2 is used.

(Reference Table 2)

| | |
|---|---|
| Center frequency | 675 MHz |
| Pass band | 0.5-0.85 GHz, 350 MHz BW |
| Pass band ripple | 0.5 $dB_{Max}$ |
| Insertion loss | 2.1 $dB_{Max}$ |
| Impedance | 50Ω |

In order to remove signals in a band less than 300 MHz and signals in the WLAN band (2.4 GHz) and to allow all frequency components that can be detected by the sensors to pass therethrough, a band pass filter having such specifications as in the following reference table 3 is used.

(Reference Table 3)

| | |
|---|---|
| Center frequency | 1,150 MHz |
| Pass band | 0.3-2 GHz, 1.7 GHz BW |
| Pass band ripple | 0.5 $dB_{Max}$ |
| Insertion loss | 2.0 $dB_{Max}$ |
| Impedance | 50Ω |

The filter matrix is not limited to the above construction, and it is also possible to use a band reject filter so as to filter out only signals in the WLAN band (2.4 GHz), in the PCS band, and in the cellular phone band, from electromagnetic signals in the UHF band, as another example.

The zero-phase detector 124 refers to a circuit implemented by applying a commercial power detector and a log amplifier, converts a signal into a reference frequency signal which has a low frequency (bandwidth <20 MHz) enabling the processing of wideband UHF signals by using envelope mode, and outputs the reference frequency signal. Preferably, the zero-phase detector 124 can be configured to exhibit relatively excellent log characteristics in an interval in which the intensity of the input signal ranges from −60 to 0 dBm, and to be sufficiently used even for signals, the intensities of which are less than −60 dBm, and for large signals, the intensities of which are about +10 dBm.

Next, the peak detection unit (the PD peak detection unit 13 or the noise peak detection unit 23) performs frequency multiplication or division on sync clocks provided by a sync generation unit (not shown), detects the peaks of a PD signal or the peaks of a noise signal in respective preset time intervals on the basis of a time sync having desired time intervals, and outputs the detected peaks. In this case, an example of setting time intervals can be implemented by discretizing signals in such a way as to divide measured analog signals into portions, each having $1/128$ seconds, or by discretizing each detected signal in such a way as to equally divide the phase of the detected signal, ranging from 0° to 360°, into 128 phases.

Next, the operating process of the noise removal apparatus of FIG. 1 will be described with reference to FIGS. 3 to 6.

Figure 3:
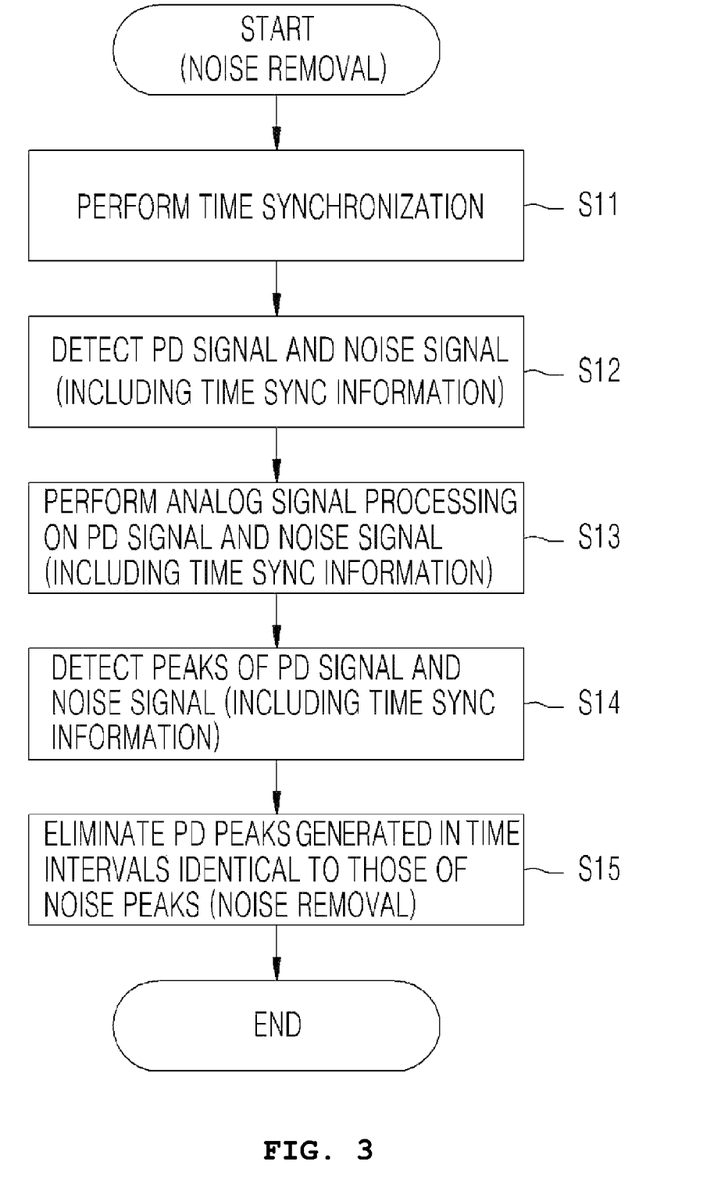
FIG. 3 is a flowchart showing a processing procedure for removing the PD noise of the power facility according to the present invention.
Figure 4A:
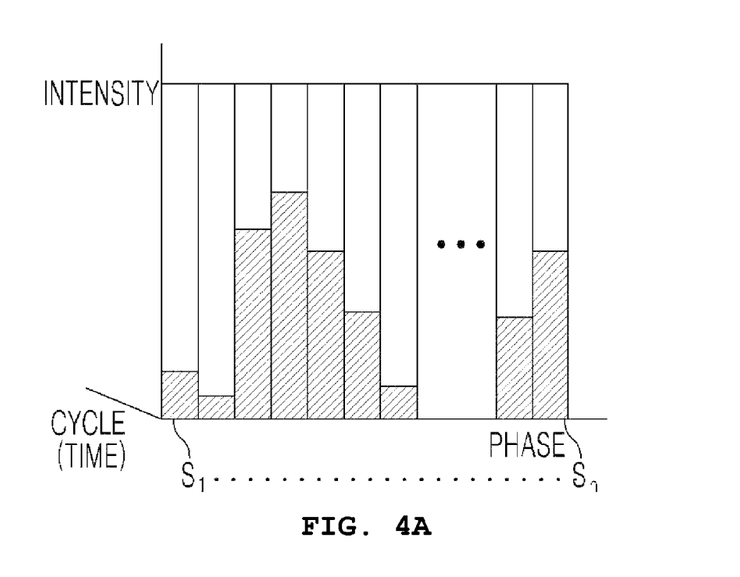
FIG. 4 is a diagram showing the peaks of a discretized PD signal and a discretized noise signal measured by the noise removal apparatus of FIG. 1.
Figure 4B:
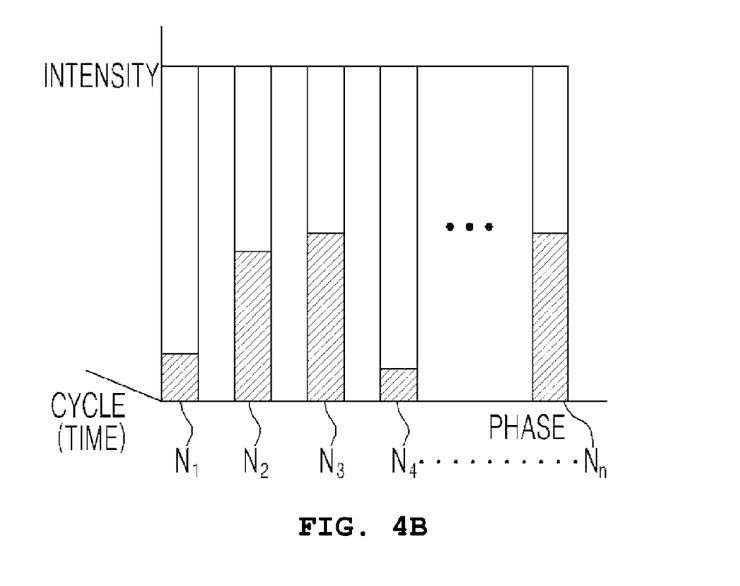
Figure 5:
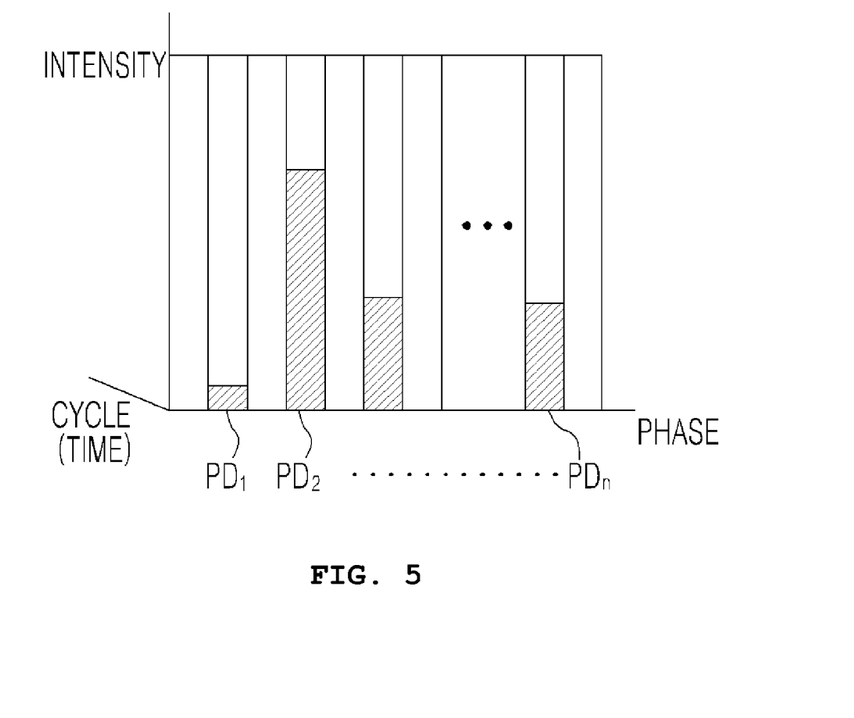
FIG. 5 is a diagram showing the peaks of a noise-free PD signal in which noise was removed from the PD signal.

FIG. 3 is a flowchart showing a processing procedure for removing the PD noise of the power facility according to the present invention, FIG. 4 is a diagram showing the peaks of a discretized PD signal and a discretized noise signal which are measured by the noise removal apparatus of FIG. 1, FIG. 5 is a diagram showing the peaks of a noise-free PD signal in which noise was removed from the PD signal, and FIG. 6 is a diagram showing a PD signal, noise, and a noise-free PD signal in the actual noise removal apparatus.

As shown in FIG. 3, the noise removal apparatus 100 of FIG. 1 performs time synchronization so as to discriminate a PD signal and a noise signal which are generated in the identical time intervals from each other at step S11.

After time synchronization has been performed, the PD signal detection unit 10 detects a PD signal using the PD measurement sensor unit 11, and the noise signal detection unit 20 detects a noise signal using the noise sensor unit 21. In this case, the PD signal or the noise signal detected by the PD measurement sensor unit 11 and the noise sensor unit 21 includes time information, and the PD signal detected by the PD measurement sensor unit 11 can contain noise at step S12.

Next, the PD signal detected by the PD measurement sensor unit 11 is converted into a reference frequency signal having a low frequency by the PD analog processing unit 12 for the purpose of signal processing, and the reference frequency signal is then input to the PD peak detection unit 13. The noise signal detected by the noise sensor unit 21 is also converted into a reference frequency signal having a low frequency for the purpose of signal processing, and the reference frequency signal is input to the PD peak detection unit 13 at step S13.

Thereafter, the PD peak detection unit 13 detects maximum signal values such as voltage values in respective preset time intervals from the PD signal which is input at the reference frequency, as the peaks of the PD signal in the respective time intervals, and outputs the peaks of the PD signal to the noise removal unit 30. The output peaks of the PD signal containing noise are shown in FIG. 4A and FIG. 6A. In FIG. 4A, S1 to Sn denote the peaks of the PD signal containing noise. Further, the noise peak detection unit 23 also detects maximum signal values such as voltage values in the respective preset time intervals from the noise signal which is input at the reference frequency, as the peaks of the noise signal in the respective time intervals, and outputs the peaks of the noise signal to the noise removal unit 30. The output peaks of the noise signal are shown in FIG. 4B and FIG. 6B. In FIG. 4B, N1 to Nn denote the peaks of the noise signal at step S14.

Next, the noise removal unit 30 that received the peaks of the PD signal and the peaks of the noise from the PD signal detection unit 10 and the noise signal detection unit 20 detects time intervals in which noise peaks are generated, and eliminates the peaks of the PD signal which are generated in the time intervals identical to those in which the peaks of the noise signal are generated, from the peaks of the PD signal, thus removing the noise signal from the PD signal. The process of removing the noise signal from the PD signal can be performed in an analog signal state or a digital signal state, as described above. FIGS. 5C and 6C show the peaks of a noise-free PD signal, in which noise peaks were eliminated from the peaks of the PD signal and which contains only the peaks of a pure PD signal. In FIG. 5, PD1 to PDn denote the peaks of the pure PD signal at step S15.

Next, the present invention can implement a PD occurrence section detection apparatus for detecting the location of the occurrence of PD in the power facility such as the GIS 1 by providing the above-described PD signal detection units 10 in parallel.

FIG. 7 is a diagram showing an apparatus for detecting a PD occurrence section of a power facility according to an embodiment of the present invention.

As shown in FIG. 7, a PD occurrence section detection apparatus 200 according to the present invention has a construction in which individual PD signal detection units 10 of FIG. 1 that are temporally synchronized are connected in parallel with a PD occurrence section detection unit 40. When the PD occurrence section detection apparatus 200 having the above construction detects PD signals and outputs the PD signals to the PD occurrence section detection unit 40, the PD occurrence section detection unit 40 mutually compares the intensities of the PD signals input from the respective PD signal detection units 10 between neighboring PD signal detection units 10, and then determines that PD has occurred in a region between neighboring PD signal detection units 10, having the minimum PD signal intensity difference therebetween, thus detecting a PD occurrence section.

In the above construction, the PD occurrence section detection unit 40 can also be configured to compare the peaks of the PD signals and detect a PD occurrence section in an analog signal state, or can be configured to convert the peaks of PD signals into digital signals, to perform digital signal processing, and to detect a PD occurrence section, similarly to the noise removal unit 30. Further, when the above-described PD occurrence section detection unit 40 is configured to perform digital signal processing, the PD occurrence section detection unit 40 can include an A/D conversion unit for converting the peak values of the PD signals input from the respective PD signal detection units 10 into digital signals, and a digital signal processing unit such as firmware for performing digital operation processing that compares the peak values of respective PD signals converted into the digital signals by the A/D conversion unit so as to detect a PD occurrence section.

In this case, when only two PD signal detection units 10 are configured, the intensities of the peaks of the PD signals which are located in the identical time intervals, among the PD signals respectively detected by the two PD signal detection units 10, are compared, and it is determined that PD has occurred at a location adjacent to the location to which the measurement sensor unit 11 of the PD signal detection unit 10, having a larger peak value, is attached, and thus a coarse PD occurrence section is detected.

In the above description of FIG. 7, each PD signal detection unit 10 has the construction of FIGS. 1 and 2, and thus a detailed description thereof will be omitted.

Unlike this, the PD occurrence section detection apparatus 200 can be configured to remove noise signals from the detected PD signals and then detect a PD occurrence section.

Figure 8:
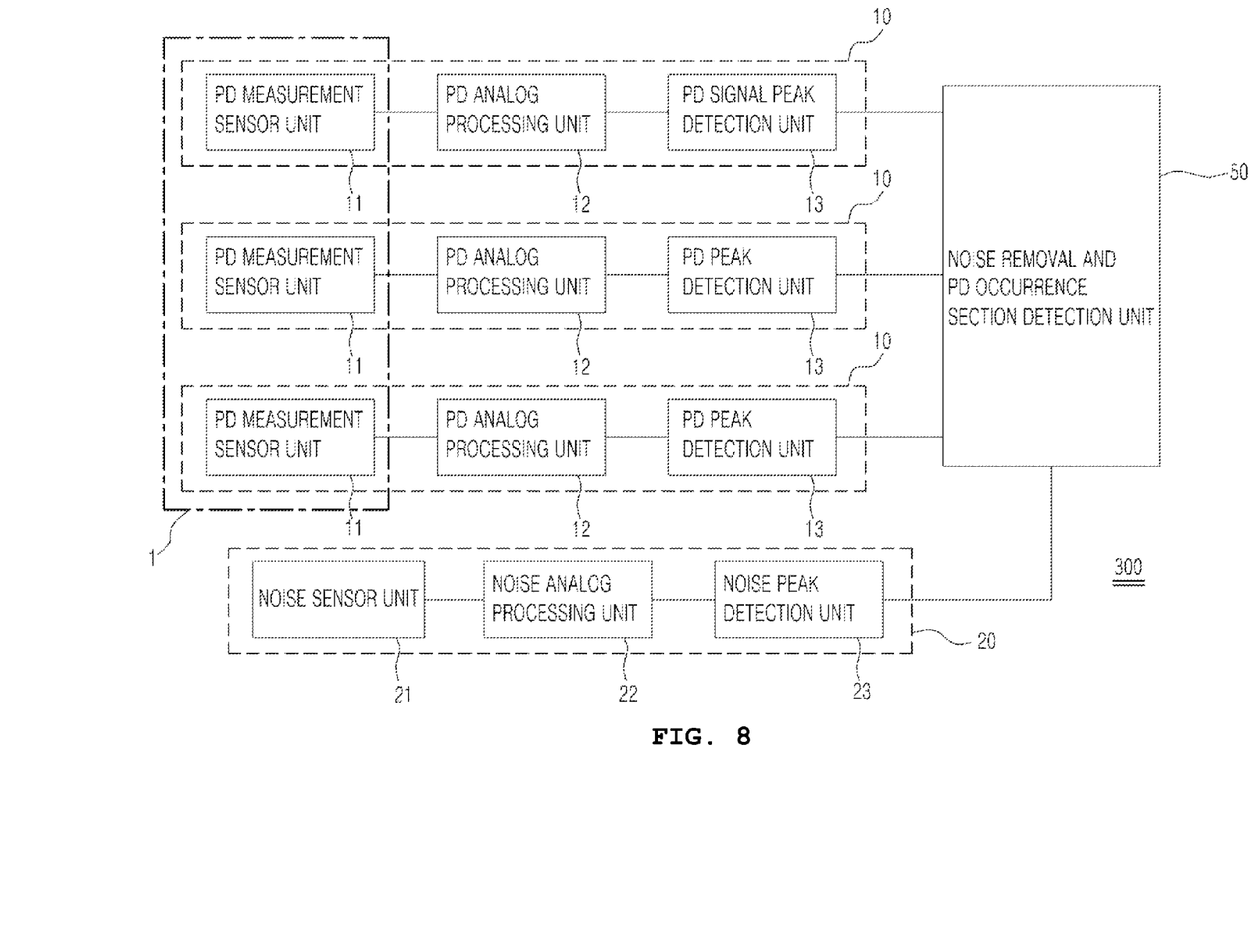
FIG. 8 is a diagram showing a PD occurrence section detection apparatus having a noise removal function.

FIG. 8 is a diagram showing a PD occurrence section detection apparatus 300 having a noise removal function.

As shown in FIG. 8, a PD occurrence section detection apparatus 300 having a noise removal function includes PD signal detection units 10 provided in parallel, a noise signal detection unit 20 configured to detect a noise signal, and a noise removal and PD occurrence section detection unit 50 configured to eliminate the peaks of PD signals caused by noise from the peaks of PD signals, by using the peaks of the PD signals and the peaks of the noise signal respectively input from the PD signal detection units 10 and the noise signal detection unit 20, to compare the peaks of the respective PD signals of neighboring PD signal detection units 10 in respective identical time intervals, and then to detect a PD occurrence section in such a way as to determine a region between two neighboring PD signal detection units 10, having the minimum peak difference therebetween to be a PD occurrence section.

In this case, the noise removal and PD occurrence section detection unit 50 can be selectively constructed according to the user so that it can perform analog processing or digital signal processing using the same manner as the above-described noise removal unit 30 and PD occurrence section detection unit 40. When the noise removal and PD occurrence section detection unit 50 is configured to perform digital signal processing, it can include an A/D conversion unit and firmware for digital operation processing.

The PD signal detection unit 10 and the noise signal detection unit 20 perform the same functions as the constructions of FIGS. 1 and 2, and thus a detailed description thereof will be omitted.

Figure 9:
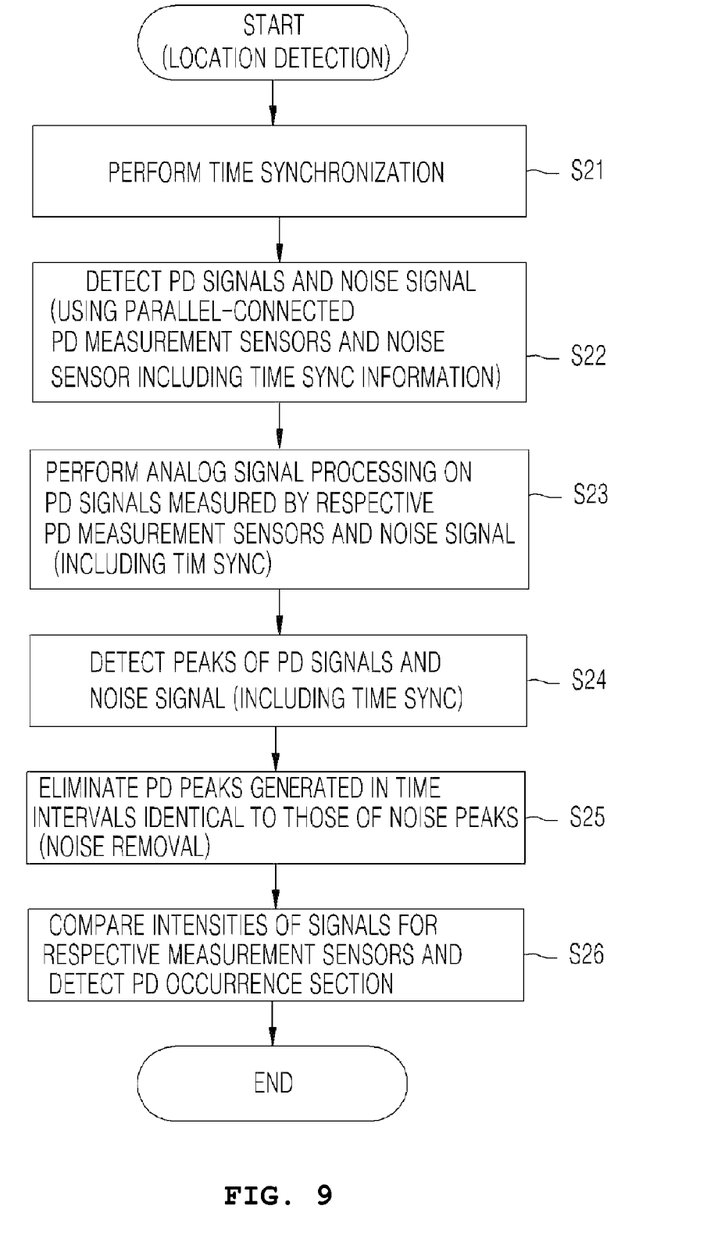
FIG. 9 is a flowchart showing a processing procedure for detecting the PD occurrence section of the power facility according to the present invention.

FIG. 9 is a flowchart showing a processing procedure for detecting a PD occurrence section using the apparatus for detecting the PD occurrence section of the power facility, having a noise removal function, according to the present invention.

As shown in FIG. 9, the PD occurrence section detection apparatus 300 of FIG. 8 performs time synchronization so that PD signals and a noise signal generated in the identical time intervals can be discriminated at step S21.

Thereafter, each PD signal detection unit 10 detects a PD signal using the PD measurement sensor unit 11, and the noise signal detection unit 20 measures and detects a noise signal using the noise sensor unit 21. In this case, the PD signal or the noise signal detected by each PD measurement sensor unit 11 and the noise sensor unit 21 contains time information, and the PD signal detected by the PD measurement sensor unit 11 can contain noise at step S22.

Next, the PD signal detected by the PD measurement sensor unit is converted into a reference frequency signal having a low frequency for signal processing by the PD analog processing unit 12, the reference frequency signal is input to the PD peak detection unit 123, and the noise signal detected by the noise sensor unit 21 is also converted into a reference frequency signal having a low frequency for signal processing, and the low frequency signal is input to the noise peak detection unit 23 at step S13.

Thereafter, each PD peak detection unit 13 detects the maximum signal values such as voltage values in the respective division time intervals from a PD signal which is input with time information divided into the predetermined time intervals, as the peaks of the PD signal in the respective time intervals, and outputs the peaks to the noise removal unit 30. Further, the noise peak detection unit 23 detects the maximum signal values such as voltage values in the respective division time intervals from the noise signal which is input with time information divided into the predetermined time intervals, as noise peaks in the respective time intervals, and outputs the noise peaks to the noise removal unit 30 at step S24.

Next, the noise removal unit 30, which received the peaks of PD signals and noise peaks from the PD signal detection units 10 and the noise signal detection unit 20, detects time intervals in which noise peaks are generated, and eliminates the peaks of the PD signals generated in the time intervals in which the noise peaks are generated from the peaks of the PD signals containing noise, thus removing the noise signal from the PD signals at step S25.

Next, among the PD signals of the neighboring PD signal detection units 10 in which the noise peaks were eliminated, the peaks of PD signals generated in the identical time intervals are mutually compared, the difference values therebetween are generated, and it is determined that a region between the PD measurement sensor units 11 of two neighboring PD signal detection units 10, having the minimum difference value therebetween, is the location of the occurrence of PD, and thus the PD occurrence section is detected at step S26.

In this case, in addition to the above methods, the method of determining a PD occurrence section can be implemented using various methods such as a method of calculating and obtaining the distance by which PD signals are generated, using attenuation characteristics depending on the distance between PD signals, and thereafter determining an intersection or an intersecting area of circles, which use two sensors as the centers of the two circles and which have the generation distances of respective PD signals as radiuses, to be the location where PD has occurred, without the scope of the spirit of the present invention.

DESCRIPTION OF REFERENCE NUMERALS OF PRINCIPAL ELEMENTS IN THE DRAWINGS

100: PD noise removal apparatus
200, 300: PD occurrence section detection apparatus
10: PD signal detection unit
11: PD measurement sensor unit
12: PD analog processing unit
13: PD signal peak detection unit
20: noise signal detection unit
21: noise sensor unit
22: noise analog processing unit
23: noise peak detection unit
30: noise removal unit
40: PD occurrence section detection unit
50: noise removal and PD occurrence section detection unit
S1-Sn: peaks of a PD signal containing noise
N1-Nn: peaks of a noise signal
PD1-PD2: peaks of a pure PD signal in which noise was removed

The invention claimed is:

1. An apparatus for removing Partial Discharge (PD) noise of a power facility, the apparatus comprising:
   a PD signal detection unit configured to detect a PD signal of the power facility, and to detect and output peaks of the PD signal in respective preset time intervals;
   a noise signal detection unit configured to detect a noise signal outside the power facility, and to detect and output peaks of the noise signal in the respective preset time intervals; and
   a noise removal unit configured to eliminate the peaks of the PD signal output in time intervals identical to those in which the peaks of the noise signal detection unit are output.

2. The apparatus according to claim 1, wherein the PD signal detection unit comprises:
   a PD measurement sensor unit installed in the power facility and configured to detect the PD signal;

a PD analog processing unit configured to convert the PD signal detected by the PD measurement sensor unit into a reference frequency signal and output the reference frequency signal; and a PD peak detection unit configured to detect peaks of the PD signal from the reference frequency signal output from the PD analog processing unit in the respective preset time intervals, and to output the detected peaks.

3. The apparatus according to claim 2, wherein the PD analog processing unit comprises:
   a low-noise amplifier configured to amplify an analog signal measured by a noise sensor unit;
   a digital control attenuator configured to adjust intensity of an output signal output from the low-noise amplifier;
   a filter matrix configured to pass only a required frequency band of the measured signal therethrough; and
   a zero-phase detector configured to convert a signal passed through the filter matrix into the reference frequency signal.

4. The apparatus according to claim 1, wherein the noise signal detection unit comprises:
   a noise sensor unit installed outside the power facility and configured to detect an external noise signal;
   a noise analog processing unit configured to convert the noise signal detected by the noise sensor unit into a reference frequency signal; and
   a noise peak detection unit configured to detect peaks of the noise signal from the reference frequency signal output from the noise analog processing unit in the respective preset time intervals, and to output the peaks.

5. The apparatus according to claim 4, wherein the noise analog processing unit comprises:
   a low-noise amplifier configured to amplify the analog signal measured by the noise sensor unit;
   a digital control attenuator configured to adjust intensity of an output signal output from the low-noise amplifier;
   a filter matrix configured to pass only a required frequency band of the measured signal therethrough; and
   a zero-phase detector configured to convert the signal passed through the filter matrix into a reference frequency signal.

6. An apparatus for detecting a Partial Discharge (PD) occurrence section of a power facility, the apparatus comprising:
   three or more PD signal detection units, each of the PD signal detection units including a PD measurement sensor attached to an inside of the power facility and configured to detect a PD signal of the power facility, and to detect and output peaks of the PD signal in respective preset time intervals;
   a PD occurrence section detection unit configured to compare intensities of the peaks of the PD signal of a PD detection unit with those of neighboring PD signal detection units for obtaining peak differences between the PD signal detection units, and to output a PD occurrence section, the PD occurrence section being a location placed between two neighboring PD detection units that have a minimum peak difference amount the peak differences, wherein each of the two or more PD signal detection units comprises:
   a PD analog processing unit configured to convert the PD signal detected by the PD measurement sensor unit into a reference frequency signal for signal processing, and to output the reference frequency signal; and
   a PD peak detection unit configured to detect peaks of the PD signal from the reference frequency signal output from the PD analog processing unit in the respective preset time intervals, and to output the detected peaks.

7. An apparatus for detecting a Partial Discharge (PD) occurrence section of a power facility, the apparatus comprising:
   two or more PD signal detection units, each installed in the power facility and configured to detect a PD signal of the power facility, and to detect and output peaks of the PD signal in respective preset time intervals;
   a noise signal detection unit configured to detect a noise signal outside the power facility, and to detect and output peaks of the noise signal in the respective preset time intervals; and
   a noise removal and PD occurrence section detection unit configured to remove a noise signal from the PD signal by eliminating peaks of the PD signal generated in time intervals identical to those in which the peaks of the noise signal detection unit are generated, and configured to compare intensities of peaks of respective PD signals of neighboring PD signal detection units of the two or more PD signal detection units, and to output a location between two of the neighboring PD signal detection units having a minimum peak difference therebetween as a PD occurrence section.

8. The apparatus according to claim 6, wherein the PD analog processing unit comprises:
   a low-noise amplifier configured to amplify an analog signal measured by a noise sensor unit;
   a digital control attenuator configured to adjust intensity of an output signal output from the low-noise amplifier;
   a filter matrix configured to pass only a required frequency band of the measured signal therethrough; and
   a zero-phase detector configured to convert a signal passed through the filter matrix into the reference frequency signal.

9. The apparatus according to claim 7, wherein the noise signal detection unit comprises:
   a noise sensor unit installed outside the power facility and configured to detect an external noise signal;
   a noise analog processing unit configured to convert the noise signal detected by the noise sensor unit into a reference frequency signal; and
   a noise peak detection unit configured to detect peaks of the noise signal from the reference frequency signal output from the noise analog processing unit in the respective preset time intervals, and to output the peaks.

10. The apparatus according to claim 9, wherein the noise analog processing unit comprises:
    a low-noise amplifier configured to amplify the analog signal measured by the noise sensor unit;
    a digital control attenuator configured to adjust intensity of an output signal output from the low-noise amplifier;
    a filter matrix configured to pass only a required frequency band of the measured signal therethrough; and
    a zero-phase detector configured to convert the signal passed through the filter matrix into the reference frequency signal.

11. The apparatus according to claim 7, wherein each of the two or more PD signal detection units comprises:
    a PD measurement sensor unit installed in the power facility and configured to detect the PD signal;
    a PD analog processing unit configured to convert the PD signal detected by the PD measurement sensor unit into a reference frequency signal for signal processing, and to output the reference frequency signal; and
    a PD peak detection unit configured to detect peaks of the PD signal from the reference frequency signal output from the PD analog processing unit in the respective preset time intervals, and to output the detected peaks.

12. The apparatus according to claim 11, wherein the PD analog processing unit comprises:
a low-noise amplifier configured to amplify an analog signal measured by a noise sensor unit;
a digital control attenuator configured to adjust intensity of an output signal output from the low-noise amplifier;
a filter matrix configured to pass only a required frequency band of the measured signal therethrough; and
a zero-phase detector configured to convert a signal passed through the filter matrix into the reference frequency signal.

* * * * *